Jan. 9, 1968 F. L. DINARDO 3,363,052
COUPLING CIRCUIT FOR A WAVE SIGNAL RECEIVER
Filed April 19, 1965
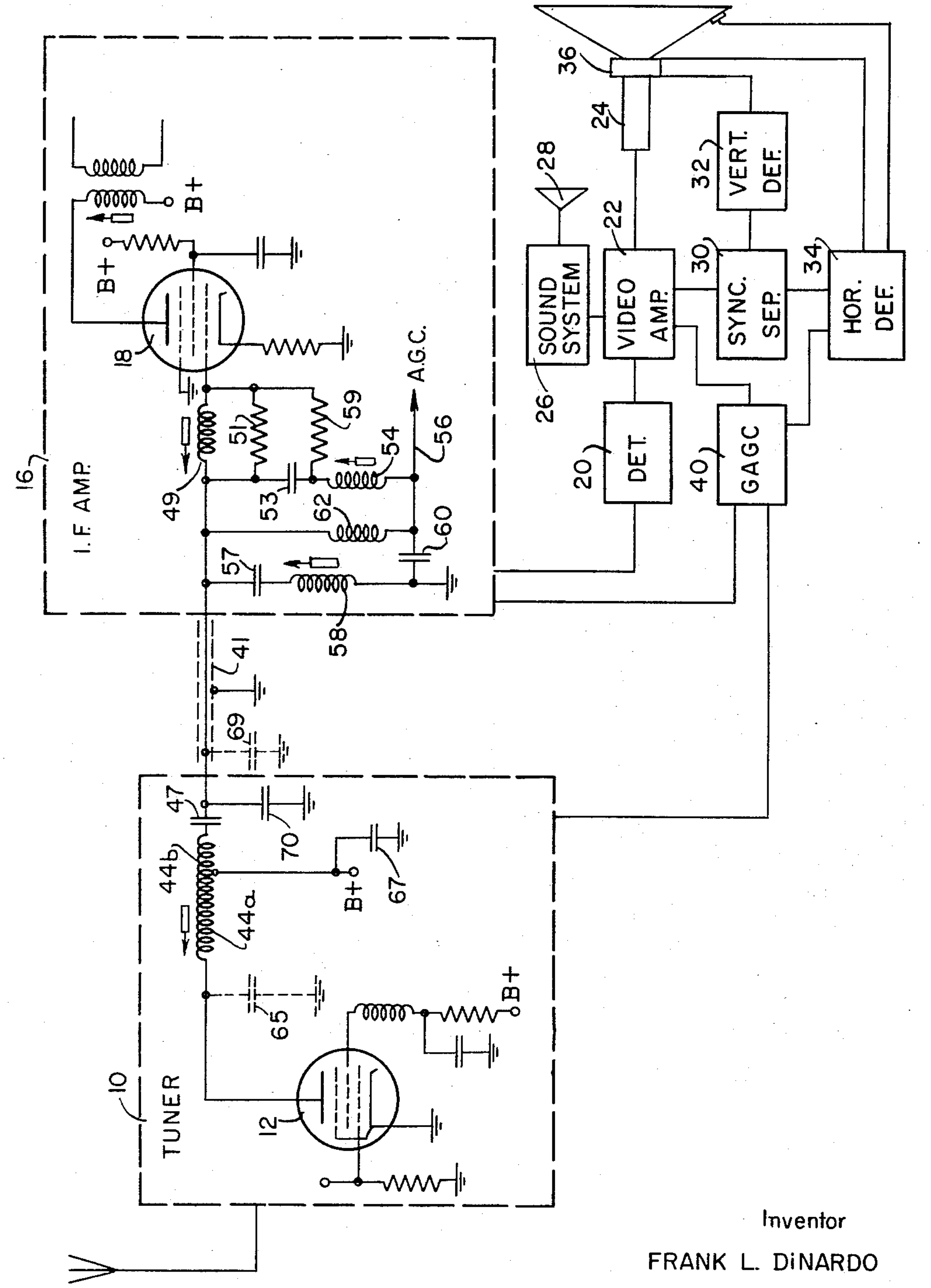
Inventor
FRANK L. DiNARDO
By Mueller, Aichele & Rauner
Attys.

United States Patent Office 3,363,052
Patented Jan. 9, 1968

3,363,052
COUPLING CIRCUIT FOR A WAVE SIGNAL RECEIVER

Frank L. Di Nardo, Mount Prospect, Ill., assignor to Motorola, Inc., Franklin Park, Ill., a corporation of Illinois Filed Apr. 19, 1965, Ser. No. 449,119
4 Claims. (Cl. 178—5.8)

ABSTRACT OF THE DISCLOSURE

The circuit includes an inductor coupled between the tuner and IF amplifier of a wave signal receiver. The inductor has a tap coupled to an AC reference potential to form input and output mutually coupled segments. A first capacitance is tuned with the input segment to a frequency within the desired passband, and the output segment is coupled with further capacitance to form a low pass filter.

In television receivers there is a frequency selective network between the output of the converter stage, or tuner, and the intermediate frequency amplifier. Such a network may include various tuned circuits and inductors and capacitors to establish a passband between approximately 41.25 megacycles and 47.25 megacycles to accommodate the modulated video carrier, generally at an IF frequency of 45.75 megacycles. Additionally, there may also be some means to establish a response to properly pass the sound subcarrier which normally occurs 4.5 megacycles below the video carrier, that is at a frequency of 41.25 megacycles.

In the frequency range above the desired passband between the converter and IF amplifier there are several types of spurious signals which can cause difficulty. For example, the signal generated by the local oscillator in the converter stage, which would be at a frequency of 45.75 megacycles higher than the frequency of the received carrier, can be translated into the IF amplifier and in that stage become modulated by noise signals which may tend to draw grid current in the first IF amplifier stage. This condition can result in an interference pattern on the screen of the picture tube. Furthermore, there can be regeneration of the local oscillator signal in the high gain IF amplifier, or spurious signal response of the receiver to other high frequency signals which may be passed to the tuner under particular conditions.

An object of this invention is to improve the attenuation in a wave signal receiver of signals of higher frequency than the intermediate frequency of the desired signal.

Another object is to reduce spurious response in the converter-to-IF amplifier coupling network of a wave signal receiver.

A further object is to increase the gain of the desired signal and improve the bandwidth characteristic in a television receiver.

A still further object is to accomplish the preceding objects at low cost by means of a simple circuit.

In a particular form of the invention, the output electrode of a converter or mixer amplifier device is coupled through an inductor to an input network of a succeeding IF amplifier stage. The inductor is wound as a single layer to minimize any series capacitance which could form an undesired high frequency coupling path therethrough. A tap on the inductor is connected to the energizing potential for the converter device and is, of course, established at signal ground by means of the usual filter or bypass. The location of the tap on the inductor provides impedance match into and out of the coupling inductor. The portion of the inductor adjacent the converter device is parallel tuned within the passband of the desired signal by means of output shunt capacitance of the converter. The side-by-side relationship of the two portions of the inductor on each side of the tap provides a mutual inductance for coupling of the desired signal. The portion of the inductor adjacent the IF amplifier, which is generally coupled thereto through a shielded cable, combines with shunt capacity of the cable and any other capacitance to form a low pass filter. Due to the construction of the coil a relatively large inductance is necessary on the IF amplifier side of the inductor in order to obtain proper coupling and accordingly there is sufficient inductance to combine with its associated shunt capacity in order to attenuate signal frequencies immediately above and beyond the highest frequency of the desired signal. In this way the receiver may exhibit improved gain characteristics for the desired signal, while at the same time exhibiting an improved bandwidth and marked suppression of undesired signal energy above the IF amplifier passband.

The drawing shows a diagram of a television receiver, partly schematic and partly in block, which incorporates the invention In the figure, the television receiver includes a tuner 10 to which the received signals are applied. In accordance with standard practice the tuner 10 may include an RF amplifier and local oscillator, and a mixer tube 12 in order to select, amplify and convert a received signal to a fixed intermediate frequency. As previously stated, the carrier of the received signal is generally converted to 45.75 megacycles.

The signal, at IF frequency, is then applied to an intermediate frequency amplifier 16 which includes a vacuum tube amplifier device 18 and one or two other similar amplifiers, not shown. In the stage 16 the signal is further amplified and passed through selective circuits. The signal is then fed to a detector 20 where it is demodulated and applied to a video amplifier stage 22. The demodulated video components are applied from the stage 22 to the picture tube 24 to be reproduced on its screen. The IF sound subcarrier is also derived from the video amplifier 22 and applied to a sound system 26 which provides amplification and demodulation for reproduction of that signal by loudspeaker 28.

Further in accordance with standard practice, the video amplifier applies the synchronizing signal components of the received signal to a sync separator circuit 30 which controls both the vertical deflection system 32 and the horizontal deflection system 34. Systems 32 and 34 are connected to the deflection yoke 36 which causes scanning of the electron beam in the cathode ray tube 24. The horizontal deflection system 34 also provides a high voltage potential for the screen of the picture tube.

The depicted receiver further includes a gated AGC system 40 to which is applied the demodulated signal of the video amplifier 22. The AGC system 40 is gated by the horizontal deflection system 34 to develop a control potential dependent on the amplitude of the synchronizing pulses in the received signal. This control potential is applied both to the tuner 10 and the IF amplifier 16 to vary the gains of these portions of the receivers inversely with respect to the amplitude of the received signal.

Turning now to the selective circuit between the output of the tuner 10 and the input of the IF amplifier 16, it will be noted that these two receiver portions are interconnected by means of a shielded cable to reduce spurious signal pickup since there may be considerable physical spacing between the subassemblies. The pentode tube 12 serves as a mixer and its input comprises the amplified and selected desired signal together with the signal of a local oscillator (not shown) which signal is 45.75 megacycles higher in frequency than the frequency of the carrier of the received signal. The anode output electrode of pentode 12 is energized with a B+ potential through the inductor portion 44*a*. Inductor portion 44*b* is inductively coupled to portion 44*a* and the converted signal, with its carrier at 45.75 mc., is coupled across these two windings to be fed to the IF amplifier 16.

Capacitor 47 serves to block B+ on the succeeding circuitry and is of large enough value to translate the signal without material effect on it. The signal is then fed through the shielded cable 41 through the tuned series peaking coil 49 to the control grid of the IF amplifier pentode tube 18. The variable inductor 49 is shunted by resistor 51 to provide the desired Q for this peaking element. A series combination of capacitor 53 and variable inductor 54 is connected between conductor 49 and the AGC lead 56. Capacitor 53 and variable inductor 54 are series tuned to 47.25 megacycles tn establish the upper frequency limit of the bandpass. Capacitor 57 and variable inductor 58 are also series connected from the inductor 49 to ground. The elements 57 and 58 are series tuned to approximately 41.25 megacycles to establish the lower frequency limit of the bandpass. Resistor 59 helps the filtering of undesired signals. The AGC lead 56 is bypassed to ground by means of capacitor 60. AGC potential (as developed by the system 40) is applied through inductor 62 and inductor 49 to the control grid of tube 18 to apply a variable DC potential thereto with respect to ground.

Inductor 62 is parallel resonance in the region adjacent to, but below, the frequency of 41.25 megacycles and provides a region of desirable receiver response in order to pass the sound subcarrier with at least a certain amplitude despite the fact that this signal may appear at various frequencies near 41.25 megacycles as the fine tuner of the television receiver is adjusted. It should be noted that the sound subcarrier may have various particular frequencies when the fine tuner is adjusted because the fine tuner of a television receiver varies the frequency of the local oscillator slightly and would, therefore, vary the intermediate frequency of the signal by a slight amount to shift it within the passband of the receiver. Further particulars of the operation of the sound signal assisting coil 62 are set forth in Di Nardo Patent 3,135,827 owned by the assignee of the present invention.

Inductor 44 is tunable by means of a variable slug and the portion 44*a* thereof is made parallel resonant at or very near the frequency of the desired signal, namely 45.75 megacycles. It will be noted that there is a capacitance 65 from the anode of tube 12 to ground and this is due to stray capacity in the circuit as well as the anode capacity of the tube. Also, it may be seen that the B+ tap on the coil 44 is bypassed to ground by means of the usual filter capacitor 67. Capacitor 67 has such a small reactance at signal frequencies that the capacitance 65 is essentially in shunt with the coil portion 44*a* so that capacitance 65, together with any shunt capacity of the coil portion itself, permit the described tuning.

It is important to minimize series coupling capacity across the inductor 44 so the coil is preferably wound as a single layer in the form of a continuous linear winding on its supporting coil form, with each turn immediately adjacent the preceding turn. In this way, the capacitance between the windings 44*a* and 44*b* on each side of the grounded B+ tap is minimized. Coupling is thus effected by the mutual inductance between winding portions 44*a* and 44*b*.

The tap point intermediate windings 44*a* and 44*b* is selected to provide an impedance matching between the output of the tuner 10 and the 50-ohm cable 41 connected to the input network of the IF amplifier 16. It may be seen that by winding the coil 44 as above described, the mutual inductance between winding portions 44*a* and 44*b* is lower than it might be if these windings were more closely coupled and, therefore, winding 44*b* may have a greater inductance than would be the case if such tighter coupling were used. Accordingly, it has been found possible to relate the value of inductance portion 44*b* (having been selected in relation to coil portion 44*a* for proper impedance match as previously stated) to the value of the shunt capacity connected to coil 44*b* form a low pass filter of particularly advantage in the system.

Shielded cable 41 will have a shunt capacitance 69 to ground and a further supplementing capacitor 70 may be connected from the IF amplifier side of coil 44 to ground to form a low pass filter in conjunction with the coil portion 44*b*.

It is possible to obtain proper impedance matching with elements 44*b*, 69 and 70 series resonant within the passband, and in any event the values of these elements are selected to provide substantial attenuation of signals in the frequency range of 50–60 megacycles and above, which is the range immediately higher than the passband of the desired signal which ends essentially at 47.25 megacycles in the example being considered.

An operative system within the teachings of the invention included parts values as follows:

Tube 12—6KZ8
Cable 41—50 ohms, 21½ inches long
Inductor 44—Wound single layer on ¼-inch diameter form with #30DSC wire; portion 44*a*, 20 turns; portion 44*b*, 12 turns
Capacitor 47—470 mmf.
Capacitor 70—30 mmf.

Tests have shown that the described circuit provides markedly improved attenuation of spurious signals above the desired passband as compared with other types of impedance coupling between the tuner and IF amplifier, such as link coupling or capacitor coupling. However, with the substantial attenuation provided by the described circuit, a signal from the local oscillator can be greatly reduced at the input of the IF amplifier 16 thus preventing regeneration of this signal or combination thereof with other types of signal energy in the video path. The described system, therefore, improves receiver response from the standpoint of attenuating undesired signals and at the same time maintaining or enhancing the coupling of the desired signal in the receiver.

I claim:

1. A selective circuit for a wave signal receiver including in combination, a signal source of modulated signal at intermediate frequency, a utilization circuit for the modulated signal, an inductor wound as a single layer and connected between said signal source and said utilization circuit, means forming a first shunt capacitance between a reference point and the juncture of said inductor with said signal source, said inductor having a tap selected to impedance match said signal source to said utilization circuit and means establishing said tap at the reference potential for signal frequencies, means forming a second shunt capacitance between the reference point and the juncture of said inductor and said utilization circuit, said inductor having mutual inductance between portions thereof on each side of said tap to provide signal coupling between said signal source and said utilization circuit with minimum coupling through any capacitance across said inductor, the value of said inductor between said tap and said signal source and the value of said first shunt capacitance providing parallel resonance in the frequency range of the modulated signal, and the portion of said inductor between said tap and said second capacitance together with said second capacitance forming a low pass filter having substantial attenuation in a frequency range starting above the highest frequency of the modulated signal.

2. A selective circuit for a television receiver including in combination, a converter circuit to provide a modulated video signal at intermediate frequency, a utilization circuit including intermediate frequency amplifier means for the video signal, an inductor wound as a single layer and connected between said converter circuit and said utilization circuit, means forming a first shunt capacitance between a reference point and the juncture of said inductor with said converter circuit, said inductor having a tap selected to impedance match said converter circuit to said utilization circuit and means providing a B+ operating potential for said converter circuit at said tap and establishing said tap at the reference potential for signal frequencies, means forming a second shunt capacitance between the reference point and the juncture of said inductor and said utilization circuit, said inductor having mutual inductance between portions thereof on each side of said tap to provide signal coupling between said converter circuit and said utilization circuit, the value of said inductor between said tap and said signal source and the value of said first shunt capacitance providing parallel resonance in the frequency range of the modulated signal, and the portion of said inductor between said tap and said second capacitance together with said second capacitance forming a low pass filter having substantial attenuation in the frequency range starting above the highest frequency of the video signal.

3. A selective circuit for a television receiver including in combination, a frequency converter circuit to provide a modulated video signal at an intermediate frequency, intermediate frequency amplifier means including a shielded cable connected as an input circuit for said amplifier means, said shielded cable having a given shunt capacitance, an inductor wound as a single layer with each turn thereof immediately adjacent the preceding turn, said inductor being connected between said converter circuit and said shielded cable, said inductor having a tap selected to impedance match said converter circuit to said shielded cable and means for grounding said tap to a reference point, capacitor means, including said shunt capacitance, connected from the interconnection of said inductor with said cable to the reference point, said inductor having a mutual inductance between portions thereof on each side of said tap to provide essentially the sole signal coupling between said converter circuit and said amplifier means, and the value of the portion of said inductor between said tap and said shielded cable, together with the value of said capacitor means, forming a low pass filter having substantial attenuation in a frequency range immediately above the highest frequency of the video signal.

4. A selective circuit for a television receiver, including in combination, a frequency converter circuit to provide a modulated video signal at an intermediate frequency, intermediate frequency amplifier means including a shielded cable connected as an input circuit for said amplifier means, said shielded cable having a given shunt capacitance, a tunable inductor wound as a single layer with each turn thereof immediately adjacent the preceding turn, said inductor being connected between said converter circuit and said shielded cable, said inductor having a tap selected to impedance match said converter circuit to said shielded cable and means for providing a B+ operating potential for said converter circuit at said tap, capacitor means, including said shunt capacitance, connected from the interconnection of said inductor with said cable to a reference point, means for tuning the portion of said inductor between said converter circuit and said tap to the intermediate frequency, said inductor having a mutual inductance between portions thereof on each side of said tap to provide essentially the sole signal coupling between said converter circuit and said amplifier means, and the value of the portion of said inductor between said tap and said shielded cable, together with the value of said capacitor means, forming a low pass filter having substantial attenuation in a frequency range immediately above the highest frequency of the video signal.

References Cited

UNITED STATES PATENTS

| | | | |
|---|---|---|---|
| 2,161,959 | 6/1939 | Hardwick et al. | |
| 2,457,774 | 12/1948 | Cawein. | |
| 2,619,536 | 11/1952 | Cotsworth et al. | |
| 3,029,400 | 4/1962 | Nelson | 333—77 |

ROBERT L. GRIFFIN, *Acting Primary Examiner.*

JOHN W. CALDWELL, *Examiner.*

R. L. RICHARDSON, *Assistant Examiner.*